(12) United States Patent
Jung et al.

(10) Patent No.: US 9,159,883 B2
(45) Date of Patent: Oct. 13, 2015

(54) ARRAY SUBSTRATE AND LIQUID CRYSTAL DISPLAY HAVING THE SAME

(71) Applicant: Samsung Display Co., Ltd., Yongin, Gyeonggi-do (KR)

(72) Inventors: Kyung-Suk Jung, Iksan-si (KR); KyoungTai Han, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 352 days.

(21) Appl. No.: 13/761,396

(22) Filed: Feb. 7, 2013

(65) Prior Publication Data

US 2014/0098317 A1    Apr. 10, 2014

(30) Foreign Application Priority Data

Oct. 10, 2012 (KR) .................. 10-2012-0112515

(51) Int. Cl.
*G02F 1/1343* (2006.01)
*H01L 33/48* (2010.01)
*G02F 1/1337* (2006.01)
*G02F 1/139* (2006.01)

(52) U.S. Cl.
CPC .............. *H01L 33/48* (2013.01); *G02F 1/1393* (2013.01); *G02F 1/13439* (2013.01); *G02F 1/133707* (2013.01); *G02F 1/134336* (2013.01)

(58) Field of Classification Search
CPC . H01L 33/48; G02F 1/13439; G02F 1/13624; G02F 2001/134372; G02F 2001/134381
USPC ........ 349/43, 48, 141, 143, 144, 139; 257/59, 257/72; 345/92
See application file for complete search history.

(56) References Cited

U.S. PATENT DOCUMENTS

| | | | |
|---|---|---|---|
| 2003/0086044 A1* | 5/2003 | Inoue et al. ................... | 349/141 |
| 2008/0246759 A1 | 10/2008 | Summers | |
| 2011/0063557 A1 | 3/2011 | Kim et al. | |
| 2011/0102713 A1* | 5/2011 | Hashimoto et al. ............. | 349/99 |
| 2011/0141423 A1* | 6/2011 | Cheng et al. ................... | 349/141 |
| 2011/0199550 A1* | 8/2011 | Fan et al. ......................... | 349/33 |
| 2011/0199568 A1* | 8/2011 | Morishita et al. ............. | 349/141 |
| 2011/0261302 A1 | 10/2011 | Ong | |
| 2011/0299024 A1 | 12/2011 | Lee et al. | |
| 2012/0224128 A1* | 9/2012 | Jung et al. ..................... | 349/129 |
| 2013/0021570 A1* | 1/2013 | Zhang .......................... | 349/139 |

FOREIGN PATENT DOCUMENTS

| | | |
|---|---|---|
| CN | 102269898 | * 12/2011 |
| JP | 2010-079316 | 4/2010 |
| JP | 2011-154101 | 8/2011 |
| KR | 1020070117903 | 12/2007 |
| KR | 1020080039043 | 5/2008 |
| KR | 1020120027710 | 3/2013 |

* cited by examiner

*Primary Examiner* — Dung Nguyen
*Assistant Examiner* — Tai Duong
(74) *Attorney, Agent, or Firm* — F. Chau & Associates, LLC

(57) ABSTRACT

An array substrate includes a gate line, a data line insulated from and crossing the gate line, and a pixel connected to the gate line and the data line. The pixel includes at least one thin film transistor connected to the gate line and the data line, and a pixel electrode connected to the thin film transistor. The pixel electrode includes a trunk portion having a cross shape and a plurality of branch portions inclined to the trunk portion and spaced apart from each other. Each branch portion includes a first area extended from the trunk portion and a second area extended from the first area, and the second area has a width greater than a width of the first area.

22 Claims, 10 Drawing Sheets

ARRAY SUBSTRATE AND LIQUID CRYSTAL DISPLAY HAVING THE SAME

CROSS-REFERENCE TO RELATED APPLICATION

This application claims priority under 35 U.S.C. §119 to Korean Patent Application No. 10-2012-0112515, filed on Oct. 10, 2012, the disclosure of which is incorporated by reference herein in its entirety.

TECHNICAL FIELD

Exemplary embodiments of the present disclosure relate to an array substrate and a liquid crystal display having the same. More particularly, exemplary embodiments of the present disclosure relate to an array substrate capable of improving display quality, and a liquid crystal display having the array substrate.

DISCUSSION OF THE RELATED ART

A liquid crystal display typically includes two transparent substrates and a liquid crystal layer disposed between the two transparent substrates. The liquid crystal display drives liquid crystal molecules of the liquid crystal layer to control a transmittance of light passing through the liquid crystal layer in each pixel, thereby displaying a desired image.

The liquid crystal display may be classified into various types depending on its operation mode. For example, a vertical alignment (VA) mode liquid crystal display arranges the liquid crystal molecules in a direction vertical to the substrates when an electric field is generated between the substrates so as to transmit the light, and thus, display an image. A patterned vertical alignment (PVA) mode liquid crystal display arranges the liquid crystal molecules in different directions using a patterned pixel electrode to form liquid crystal domains. As a result, the PVA mode liquid crystal display may have an improved viewing angle. The pixel electrode is patterned to include plural plurality of fine slits, and the liquid crystal molecules are driven by a fringe electric field formed between the fine slits.

In the PVA mode liquid crystal display, the transmittance may be degraded in an area in which end portions of the fine slits are disposed. As a result, a display defect (e.g., a stain) may appear on the display.

SUMMARY

Exemplary embodiments of the present disclosure provide an array substrate capable of improving a display quality.

Exemplary embodiments of the present disclosure provide a liquid crystal display having the array substrate.

Exemplary embodiments of the present disclosure provide an array substrate including a gate line, a data line insulated from and crossing the gate line, and a pixel including at least one thin film transistor connected to the gate line and the data line, and a pixel electrode connected to the thin film transistor. The pixel electrode includes a trunk portion having a cross shape and a plurality of branch portions, each including a first area extended from the trunk portion and a second area extended from the first area. The branch portions are inclined to the trunk portion and are spaced apart from each other, and the second area has a width greater than a width of the first area.

A distance between two adjacent first areas may be greater than a distance between two adjacent second areas.

A width of the first area may be equal to the distance between the two adjacent first areas.

A sum of the distance between the two adjacent first areas and the width of the first area may be equal to a sum of the distance between the two adjacent second areas and a width of the second area.

Exemplary embodiments of the present disclosure provide a liquid crystal display including the array substrate, an opposite substrate facing the array substrate and including a common electrode, and a liquid crystal layer interposed between the array substrate and the opposite substrate.

Exemplary embodiments of the present disclosure provide a pixel electrode including a trunk portion and a plurality of branch portions extending from the trunk portion and spaced apart from each other. Each of the branch portions is disposed in a first area adjacent to the trunk portion and a second area adjacent to the first area, and a distance between adjacent branch portions in the first area is greater than a distance between the adjacent branch portions in the second area.

According to exemplary embodiments of the present disclosure, the array substrate may prevent the transmittance from being lowered in the area corresponding to the end portions of the branch portions. Thus, the display quality of the liquid crystal display may be improved.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EXEMPLARY EMBODIMENTS

Figure 1:
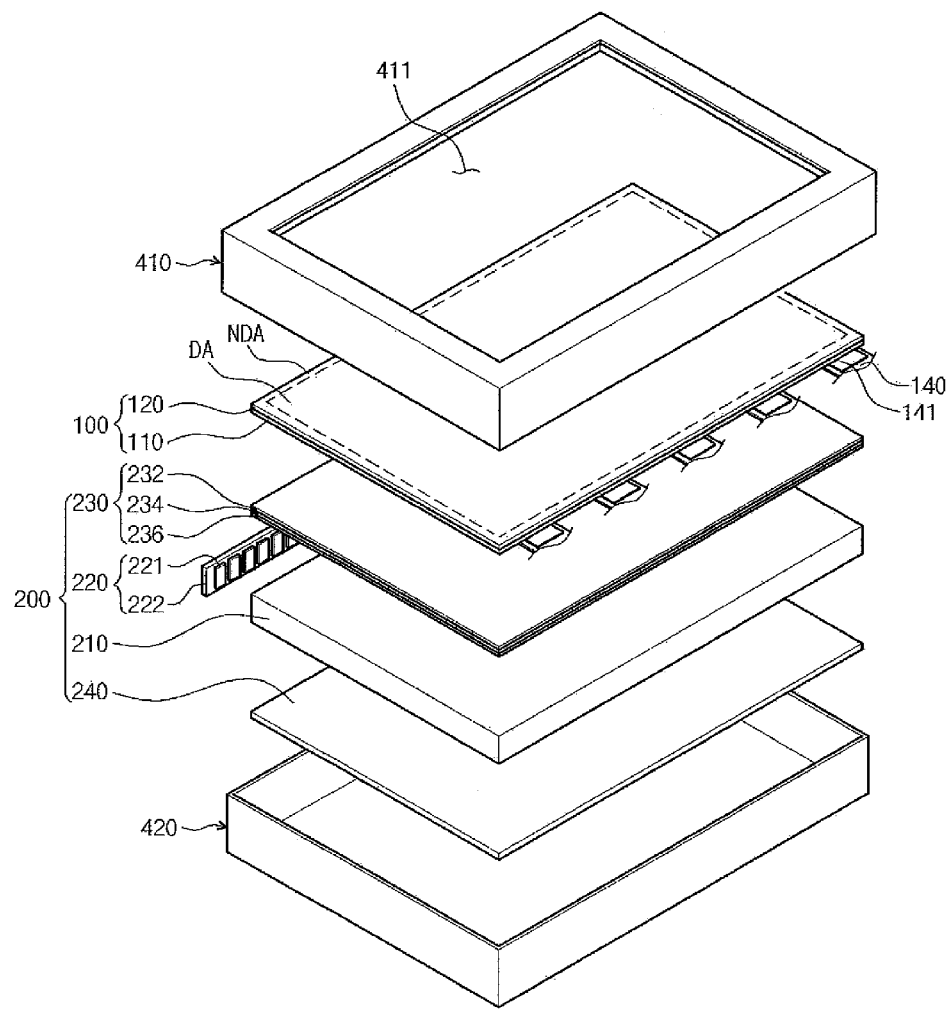
FIG. 1 is an exploded perspective view showing a liquid crystal display, according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. Like reference numerals may refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Hereinafter, exemplary embodiments of the present invention will be described with reference to the accompanying drawings.

FIG. 1 is an exploded perspective view showing a liquid crystal display according to an exemplary embodiment of the present disclosure.

Referring to FIG. 1, a liquid crystal display includes a liquid crystal display panel 100, a backlight unit 200, an upper cover 410, and a lower cover 420.

The liquid crystal display panel 100 has a rectangular plate shape with long sides and short sides, and includes a display area DA in which an image is displayed and a non-display area NDA disposed adjacent to the display area DA in which an image is not displayed. In addition, the liquid crystal display panel 100 includes an array substrate 110, an opposite substrate 120 facing the array, substrate 110, and a liquid crystal layer interposed between the array substrate 110 and the opposite substrate 120. The liquid crystal display panel 100 further includes a polarizing film attached to its outer surfaces, e.g., an outer surface of the array substrate 110 and an outer surface of the opposite substrate 120.

The array substrate 110 includes a plurality of pixels arranged in the display area DA in a matrix form. Each pixel includes a plurality of sub-pixels having different colors from each other. For example, each of the sub-pixels may have a red, green, blue, cyan, magenta, or yellow color. Thus, a light exiting from the sub-pixel may have one of the red, green, blue, cyan, magenta, or yellow colors. In addition, each pixel is connected to a gate line and a data line insulated from and crossing the gate line, and includes a pixel electrode. Further, each pixel includes a thin film transistor electrically connected to the gate line, the data line, and the pixel electrode. The thin film transistor switches a driving signal applied to a corresponding pixel electrode.

A seal pattern is disposed in the non-display area NDA of the array substrate 110. The seal pattern couples the array substrate 110 to the opposite substrate 120.

The opposite substrate 120 includes a color filter that generates a predetermined color using light provided from the backlight unit 200, and a common electrode disposed on the color filter and facing the pixel electrode. The color filter has one of the red, green, blue, cyan, magenta, and yellow colors, and may be formed by a deposition or a coating process. Although the color filter is disposed on the opposite substrate 120 in the exemplary embodiment shown in FIG. 1, the location of the color filter is snot limited thereto. For example, the color filter may be disposed on the array substrate 110.

The liquid crystal layer includes liquid crystal molecules arranged in a specific direction in, response to an electric field generated by voltages applied to the pixel electrode and the common electrode. Thus, the liquid crystal layer controls a transmittance of the light passing through the liquid crystal molecules, thereby displaying desired images.

In the non-display area NDA, a signal input pad is disposed on the outer surface of the array substrate 110 or the opposite substrate 120. The signal input pad is connected to a flexible circuit board 140 on which a driver IC 141 is mounted, and the flexible circuit board 140 is connected to an external circuit module. Various control signals may be applied to the driver IC 141 by the external circuit module, and the driver IC may apply the driving signal driving the liquid crystal display panel 100 to the thin film transistor in response to the various control signals.

The backlight unit 200 is disposed in an opposite direction to the direction in which the light exiting from the liquid crystal display panel 100 travels. The backlight unit 200 includes a light guide plate 210, a light source unit 220 including a plurality of light sources, an optical member 230, and a reflective sheet 240.

The light guide plate 210 is disposed under the Liquid crystal display panel 100 and guides the light emitted from the light source unit 220 to the liquid crystal display panel 100. The light guide plate 210 is overlapped with at least the display area DA of the liquid crystal display panel 100. The light guide plate 210 includes an exit surface from which the light exits, a lower surface facing the exit surface, and side surfaces connecting the exit surface and the lower surface. At least one of the side surfaces of the light guide plate 210 faces the light source unit 220 and serves as a light incident surface into which the light emitted from the light source unit 220 is incident. The side surface facing the side surface that serves as the light incident surface is an opposite surface that serves as a reflective surface to reflect the light.

The light source unit 220 includes a printed circuit board 222 and the light sources 221. The light sources 221 may be, for example, light emitting diodes, which are mounted on the printed circuit board 222.

In an exemplary embodiment, the light sources 221 may emit light having the same color (e.g., a white light).

In an exemplary embodiment, the light sources 221 may emit lights having different colors from each other. For example, one part of the light sources 221 may emit a red light, another part of the light sources 221 may emit a green light, and another part of the light sources 221 may emit a blue light.

The light source unit 220 faces at least one side surface of the light guide plate 210, emits the light in a direction toward the at least one side surface, and provides the light to the liquid crystal display panel 100 through the light guide plate 210.

The optical member 230 is disposed between the light guide plate 210 and the, liquid crystal display panel 100. The optical member 230 controls the light exiting through the light guide plate 210 from the light source unit 220. In addition, the optical member 230 includes a diffusion sheet 236, a prism sheet 234, and a protective sheet 232, which are sequentially stacked.

The diffusion sheet 236 diffuses the light exiting from the light guide plate 210. The prism sheet 234 condenses the light diffused by the diffusion sheet 236, allowing the light to travel in a direction substantially vertical to the liquid crystal display panel 100. The light exiting from the prism sheet 234 is vertically incident to the liquid crystal display panel 100. The protective sheet 232 is disposed on the prism sheet 234, and protects the prism sheet 234 from external impact.

In an exemplary embodiment, the optical member 230 includes one diffusion sheet 236, one prism sheet 234, and one protective sheet 232, however, the optical member 230 is not limited thereto. For example, at least one of the diffusion sheet 236, the prism sheet 234, and the protective sheet 232 may be provided in plural number, or at least one of the diffusion sheet 236, the prism sheet 234, and the protective sheet 232 may be omitted from the optical member 230.

The reflective sheet 240 is disposed under the light guide plate 210 and reflects the light leaked from the light guide plate 210 away from the liquid crystal display panel 100 (e.g., the reflective sheet 240 changes a path of the light leaked from the light guide plate 210 toward the liquid crystal display panel 100). The reflective, sheet 240 includes a light reflective material that reflects the light. The reflective sheet 240 is disposed on the lower cover 420 and reflects the light emitted from the light source unit 220. As a result, the reflective sheet 240 increases an amount of the light provided to the liquid crystal display panel 100.

In an exemplary embodiment, the light source unit 220 is disposed such that it provides the light to the side surfaces of the light guide plate 210, however, the manner in which the light source unit 220 is disposed is not limited thereto. For example, the light source unit 220 may be disposed such that it provides the light to the lower surface of the light guide plate 210. In addition, if the light guide plate 210 is omitted from the backlight unit 200, the light source unit 220 may be disposed under the liquid crystal display panel 100, and the light emitted from the light source unit 220 may be directly provided to the liquid crystal display panel 100.

The upper cover 410 is disposed on the liquid crystal display panel 100. The upper cover 410 includes a display window 411, which exposes the display area DA of the liquid crystal display panel 100. The upper cover 410 is coupled with the lower cover 420, and supports a front edge portion of the liquid crystal display panel 100.

The lower cover 420 is disposed under the backlight unit 200. The lower cover 420 provides a space that accommodates the liquid crystal display panel 100 and the backlight unit 200. In addition, the lower cover 420 is coupled with the upper cover 410 to accommodate the liquid crystal display panel 100 and the backlight unit 200 therein.

Figure 2:
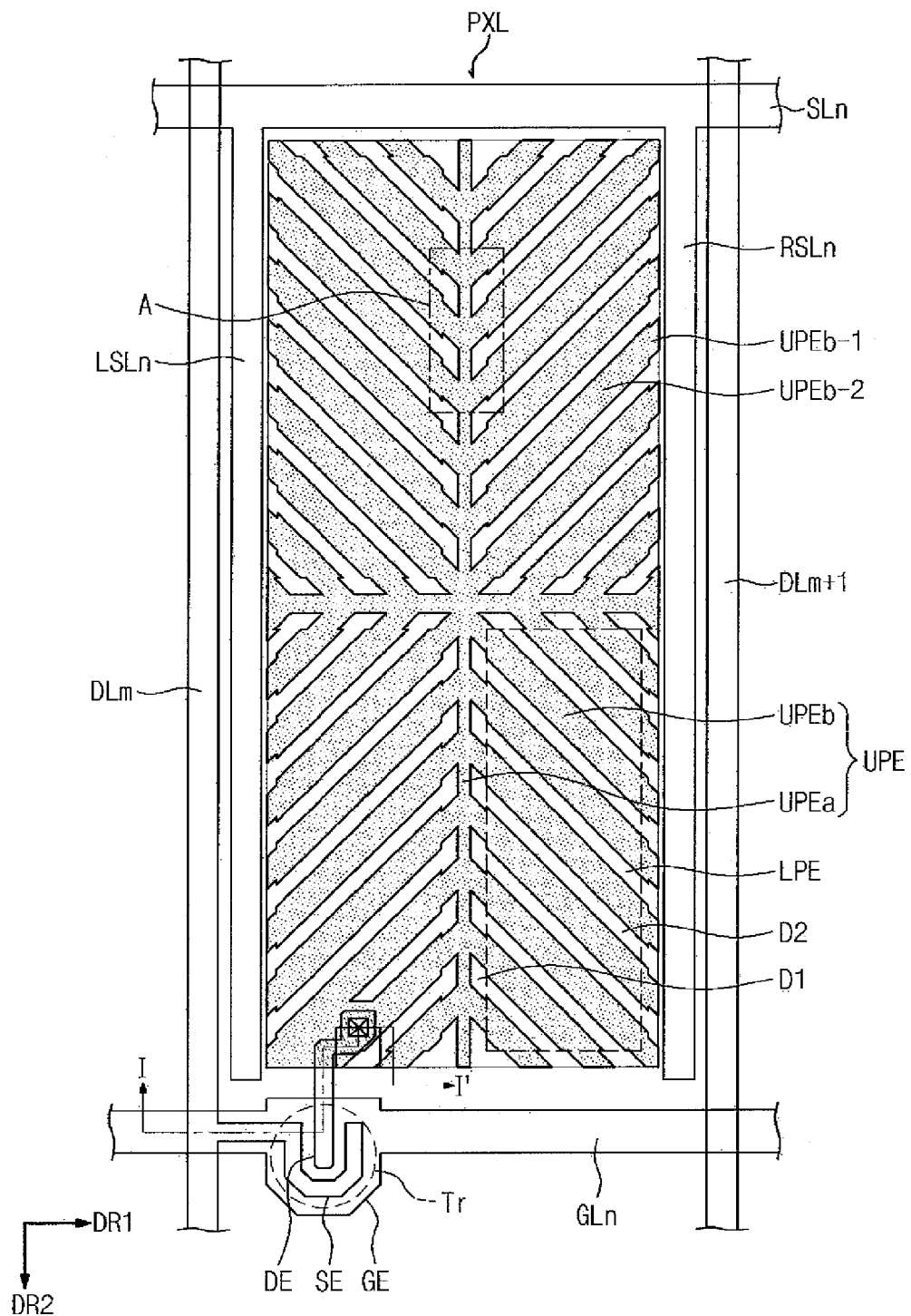
FIG. 2 is a plan view showing the liquid crystal display panel shown in FIG. 1, according to an exemplary embodiment of the present disclosure.
Figure 3:
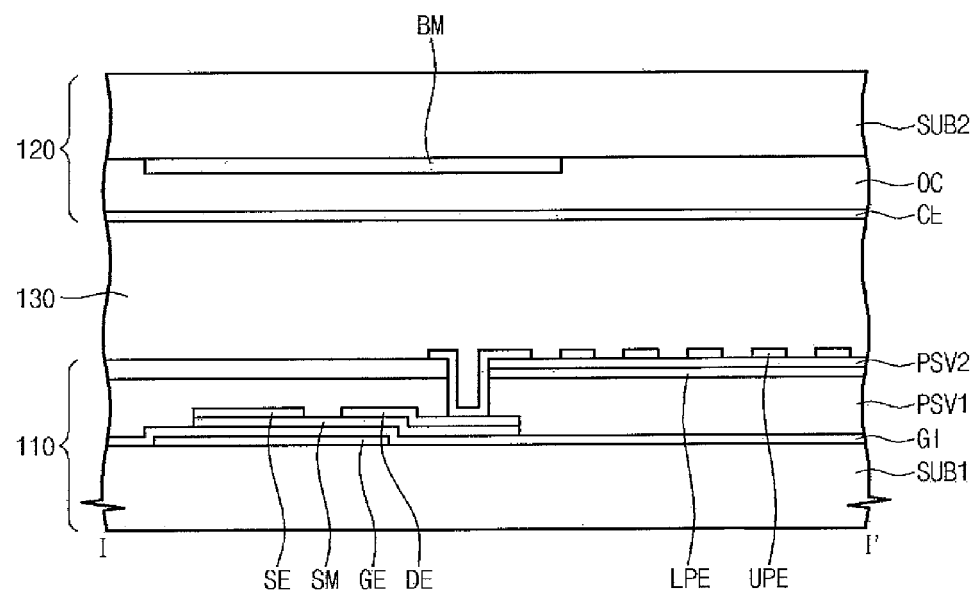
FIG. 3 is a cross-sectional view taken along line I-I' shown in FIG. 2, according to an exemplary embodiment of the present disclosure.

FIG. 2 is a plan view showing the liquid crystal display panel shown in FIG. 1. FIG. 3 is a cross-sectional view taken along line I-I' shown in FIG. 2.

Referring to FIGS. 2 and 3, the liquid crystal display panel 100 includes the array substrate 110, the opposite substrate 120 facing the array substrate 110, and the liquid crystal layer 130 interposed between the array substrate 110 and the opposite substrate 120.

The array substrate 110 is a thin film transistor array substrate on which the thin film transistors are disposed to drive liquid crystal molecules of the liquid crystal layer 130. The opposite substrate 120 faces the array substrate 110. The liquid crystal layer 130 includes the liquid crystal molecules having a dielectric anisotropy.

The liquid crystal molecules are vertically aligned liquid crystal molecules, which are aligned in a direction with respect to the array substrate 110 and the opposite substrate 120, between the array substrate 110 and the opposite substrate 120. When an electric field is generated between the array substrate 110 and the opposite substrate 120, the liquid crystal molecules are rotated in a specific direction between the array substrate 110 and the opposite substrate 120. Light is transmitted or blocked based on the alignment of the liquid crystal molecules. In an exemplary embodiment, the term "rotation of the liquid crystal molecules" may refer to the liquid crystal molecules being tilted in a horizontal direction with respect to the array substrate 110 or the opposite substrate 120. In addition, the term "rotation of the liquid crystal molecules" may refer to both the actual rotation of the liquid crystal molecules and the alignment of the liquid crystal molecules that is changed by the electric field.

The array substrate 110 includes a first base substrate SUB1 having a plurality of pixel areas. The first base substrate SUB1 includes n+p gate lines GL1, . . . , GLn, GLn+1, . . . , GL(n+p)−1, and GLn+p and m+q data lines DL1, . . . , DLm, DLm+1, DL(m+q)−1, and DLm+q.

Each pixel area includes a pixel PXL. Each pixel PXL is connected to one of the gate lines GL1, . . . , GLn, GLn+1, . . . , GL(n+p)−1, GLn+p and one of the data lines DL1, . . . , DLm, DLm+1, . . . , DL(m+q)−1, DLm+q.

In FIG. 2, a pixel having an n-th gate line GLn and an m-th data line DLm is illustrated. Other pixels PXL of the array substrate 110 may have substantially the same structure as the pixel PXL shown in FIG. 2. Hereinafter, the n-th gate line GLn and the m-th data line DLm will be referred to as the gate line GLn and the data line DLm, respectively.

Each pixel PXL includes the thin film transistor Tr connected to the gate line GLn and the data line DLm, a lower pixel electrode LPE and an upper pixel electrode UPE, which are connected to the thin film transistor Tr, and a storage electrode part.

The gate line GLn is extended in a first direction DR1 on the first base substrate SUB1. The data line DLm is extended in a second direction DR2 that is substantially perpendicular to the first direction DR1. A gate insulating layer GI is interposed between the gate line GLn and the data line DLm.

The thin film transistor Tr includes a gate electrode GE, a semiconductor layer SM, a source electrode SE, and a drain electrode DE.

The gate electrode GE is protruded from the gate line GLn, or formed on a portion of the gate line GLn.

The semiconductor layer SM is overlapped with the gate electrode GE while interposing the gate insulating layer GI therebetween.

The source electrode SE is branched from the data line DLm and partially overlaps with the gate line GLn. The drain electrode DE is spaced apart from the source electrode SE while interposing the semiconductor layer SM therebetween, and a portion of the drain electrode DE is overlapped with the gate line GLn.

A first passivation layer PSV1 is disposed on the first base substrate SUB1 on which the source and drain electrodes SE and DE are disposed. That is, the first passivation layer PSV1 covers the thin film transistor Tr.

The lower pixel electrode LPE may be integrally formed as a single unitary and individual plate unit on the first passivation layer PSV1.

A second passivation layer PSV2 is disposed on the first base substrate SUB1 on which the lower pixel electrode LPE is disposed, and the upper pixel electrode UPE is disposed on the second passivation layer PSV2. The upper pixel electrode UPE is overlapped with the lower pixel electrode LPE, and the second passivation layer PSV2 is interposed between the upper pixel electrode UPE and the lower pixel electrode LPE.

As described above, the upper pixel electrode UPE is overlapped with at least a portion of the lower pixel electrode LPE. The first and second passivation layers PSV1 and PSV2 include a contact hole formed therethrough that exposes a portion of the drain electrode DE, and the upper pixel electrode UPE makes contact with the drain electrode DE through the contact hole. The lower pixel electrode LPE may make direct contact with the upper pixel electrode UPE formed inside the contact hole so as to be electrically connected to the drain electrode DE.

The upper pixel electrode UPE includes a trunk portion UPEa and a plurality of branch portions UPEb that extend from the trunk portion UPEa and are spaced apart from each other.

As shown in FIG. 2, the trunk portion UPEa may have a cross shape, and thus, the pixel PXL may be divided into a plurality of area (e.g., a plurality of domains). The branch portions UPEb may be arranged in a different direction in each domain. In the exemplary embodiment shown in FIG. 2, the pixel PXL includes four domains. Each of the domains includes an adjacent area D1 adjacent to the trunk portion UPEa, and a distant area D2. The distant area D2 has a size greater than a size of the adjacent area D1.

The branch portions UPEb are spaced apart from each other, which prevents adjacent branch portions UPEb from making contact with each other, and are arranged substantially parallel to each other in the area divided by the trunk portion UPEa. The branch portions UPEb are spaced apart from each other at a uniform distance. As a result, the liquid crystal molecules of the liquid crystal layer 130 are aligned in a specific azimuth angle on a plane parallel to the first base substrate SUB1. The branch portions UPEb are inclined to the trunk portion UPEa. Each of the branch portions UPEb includes a first area UPEb-1 extended from the trunk portion UPEa, and a second area UPEb-2 extended from the first area UPEb-1. The first area UPEb-1 is disposed in the adjacent area D1, and the second area UPEb-2 is disposed in the distant area D2.

The second area UPEb-2 has a width greater than a width of the first area UPEb-1. Therefore, a distance between two adjacent first areas UPEb-1 is greater than a distance between two adjacent second areas UPEb-2.

The storage electrode part includes a storage line SLn extended in the first direction DR1, and a first branch electrode LSLn and a second branch electrode RSLn, which are branched from the storage line SLn and extended in the second direction DR2. The upper pixel electrode UPE is partially overlapped with the storage line SLn, the first branch electrode LSLn, and the second branch electrode RSLn, and forms a storage capacitor. In addition, the first and second branch electrodes LSLn and RSLn may shield a coupling electric field between the data line DLm and the upper and lower pixel electrodes UPE and LPE.

The opposite substrate 120 includes a second base substrate SUB2, a black matrix BM, an overcoat layer OC, and a common electrode CE.

The black matrix BM is disposed on the second base substrate SUB2 in an area corresponding to an area in which the data line DLm is arranged, and may prevent or reduce light leakage caused by a misalignment of the liquid crystal molecules.

The overcoat layer OC is disposed on the black matrix BM and may reduce a step difference due to the black matrix BM.

The common electrode CE is disposed on the overcoat layer OC and receives a voltage having a predetermined level, forming the electric field with the lower pixel electrode LPE and the upper pixel electrode UPE.

In the liquid crystal display described above, when a gate signal is applied to the gate line GLn, the thin film transistor TR is turned on. Then, the data signal applied to the data line DLm is provided to the lower pixel electrode LPE and the upper pixel electrode UPE through the turned-on thin film transistor Tr. As a result, voltages having the same level are applied to the lower pixel electrode LPE and the upper pixel electrode UPE. The common electrode CE receives a voltage having a different level from the voltages applied to the lower pixel electrode LPE and the upper pixel electrode UPE, and thus, the electric field is generated between the common electrode CE and the lower and upper pixel electrodes LPE and UPE. As a result, the liquid crystal molecules of the liquid crystal layer 130 are aligned to allow the liquid, crystal display to transmit the light.

Figure 4:
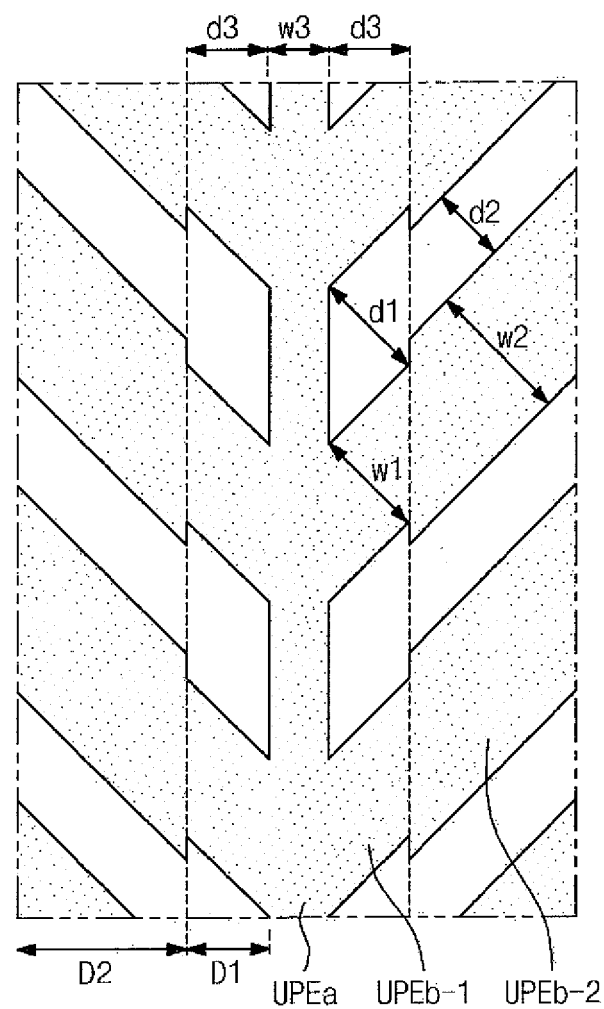
FIGS. 4 to 6 are plan views showing portion A of FIG. 2, according to exemplary embodiments of the present disclosure.
Figure 5:
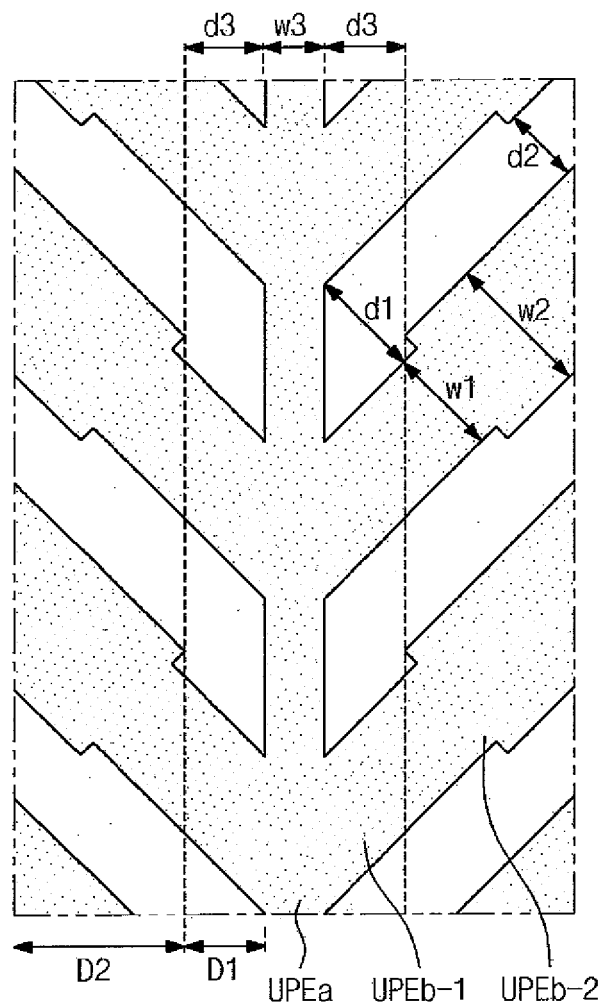
Figure 6:
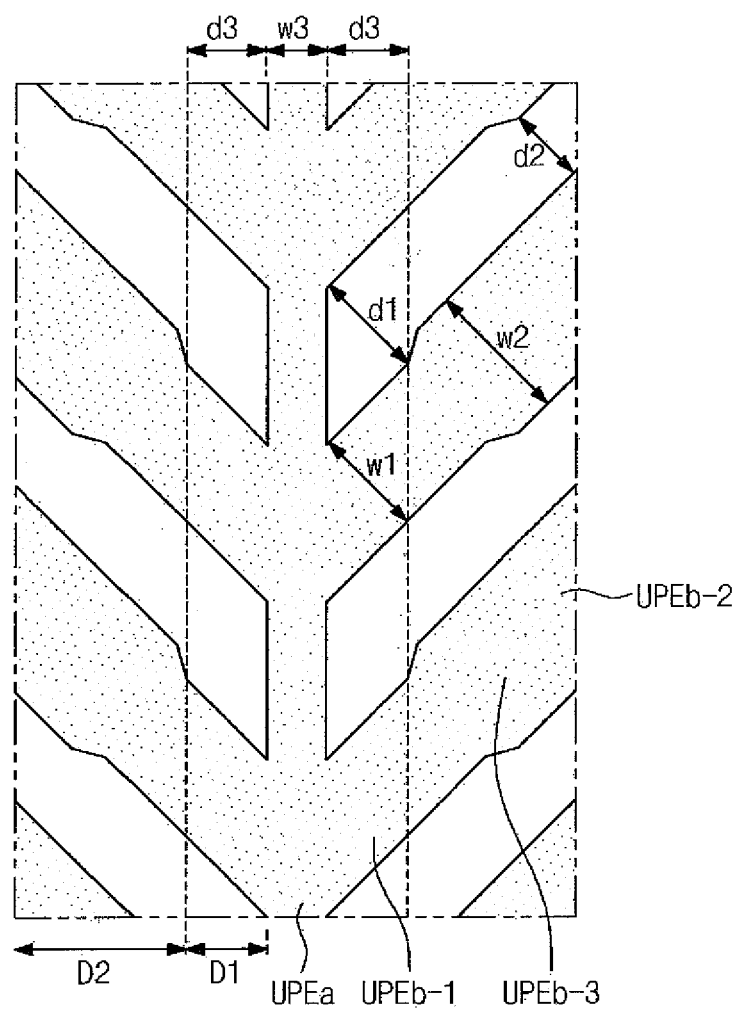

FIGS. 4 to 6 are enlarged views showing portion A of FIG. 2, according to exemplary embodiments of the present disclosure, showing various shapes of the branch portions.

Referring to FIGS. 4 to 6, the upper pixel electrode UPE includes the trunk portion UPEa, and the branch portions UPEb extended from the trunk portion UPEa and spaced apart from each other.

The branch portions UPEb are spaced apart from each other so as not to be overlapped with adjacent branch portions UPEb thereto, and the branch portions UPEb are extended substantially parallel to each other in each domain divided by the trunk portion UPEa. The branch portions UPEb are spaced apart from each other at a uniform distance. As a result, the liquid crystal molecules of the liquid crystal layer 130 are aligned in a specific azimuth angle on the plane substantially parallel to the first base substrate SUB1.

The branch portions UPEb are inclined to the trunk portion UPEa. In addition, the branch portions UPEb include the first area UPEb-1 extended from the trunk portion UPEa and the second area UPEb-2 extended from the first area UPEb-1.

The width w2 of the second areas UPEb-2 is greater than the width w1 of the first areas UPEb-1. Therefore, the distance d1 between the two adjacent first areas UPEb-1 is greater than the distance d2 between the two adjacent second areas UPEb-2.

In addition, the width w1 of the first areas UPEb-1 may be substantially the same as the distance d1 between the two adjacent first areas UPEb-1.

Further, a sum of the distance d1 between the two adjacent first areas UPEb-1 and the width w1 of the first area UPEb-1 may be substantially the same as a sum of the distance d2 between the two adjacent second areas UPEb-2 and the width w2 of the second area UPEb-2.

In addition, a distance d3 between the trunk portion UPEa and the second areas UPEb-2 may be equal to a distance between the trunk portion UPEa and the distant areas D2. The distance d3 between the trunk portion UPEa and the second areas UPEb-2 may be about one to about three times a width w3 of the trunk portion UPEa. The distance d3 between the trunk portion UPEa and the second areas UPEb-2 may be in a range from about 10 μm to about 20 μm. The width w3 of the trunk portion UPEa may be in a range from about 1 μm to about 8 μm.

The first area UPEb-1 and the second area UPEb-2 may be formed such that the space between the branch portions within each of the first area UPEb-1 and the second area UPEb-2 substantially has the shape of a parallelogram, as shown in FIG. 4. That is, each of the first area UPEb-1 and the second area UPEb-2 may have two substantially parallel edges parallel to each other and inclined to the trunk portion UPEa, and an edge extending substantially in the DR2 direction connecting the parallel edges of the first area UPEb-1 with parallel edges of the second area UPEb-2.

As shown in FIG. 5, the first area UPEb-1 may be formed such that the space between the branch portions within the first area UPEb-1 has a substantially trapezoidal shape. That is, the first area UPEb-1 may have two substantially parallel edges that are inclined to the trunk portion UPEa. One of the substantially parallel edges may extend in the same direction to form an edge of the second area UPEb-2, and the other one of the substantially parallel edges may connect to an edge that is substantially perpendicular to the parallel edges. Another edge of the second area UPEb-2 extends from the substantially perpendicular edge, parallel to the other edge of the second area UPEb-2, as shown in FIG. 5.

As shown in FIG. 6, the branch portions UPEb may further include a third area UPEb-3 connecting the first areas UPEb-1 and the second areas UPEb-2. A portion of the third area UPEb-3, which makes contact with the first area UPEb-1, may have substantially the same width as that of the first area UPEb-1, and a portion of the third area UPEb-3, which makes contact with the second area UPEb-2, may have substantially the same width as that of the second areas UPEb-2.

When the width of the first area UPEb-1 is substantially the same as the width of the second area UPEb-2, a transmittance of the light in the adjacent area D1 may be lowered. Accordingly, a viewing defect (e.g., a stain) may appear in the adjacent area D1, which may be perceived by a viewer. According to exemplary embodiments of the present disclosure, when a distance between adjacent branch portions UPEb in the first area UPEb-1 is greater than a distance between adjacent branch portions UPEb in the second area UPEb-2, the transmittance of the light in the adjacent area D1 may be prevented from decreasing. Thus, the appearance of the stain may be prevented or reduced.

Figure 7:
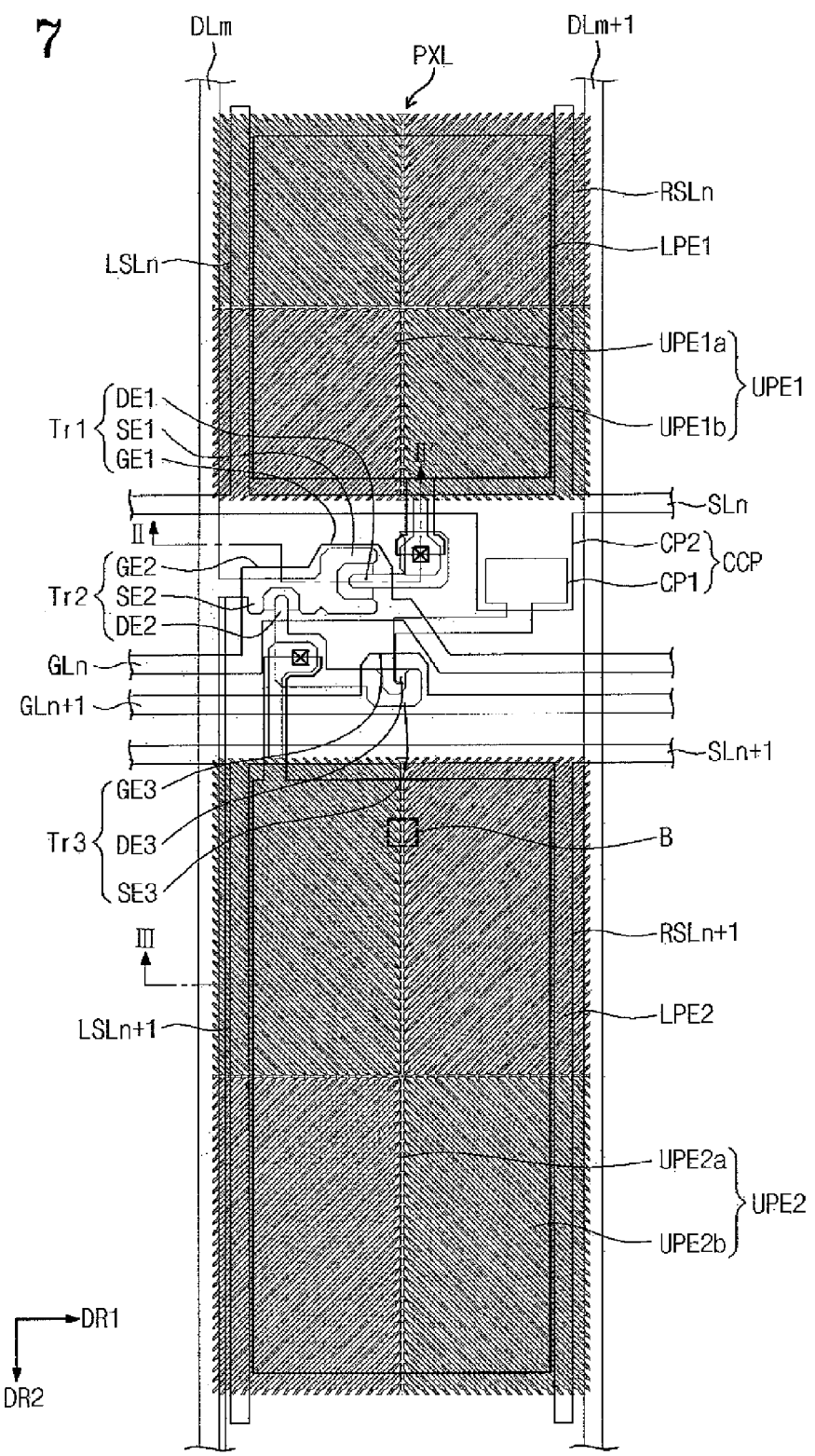
FIG. 7 is a plan view showing a portion of a liquid crystal display, according to an exemplary embodiment of the present disclosure.
Figure 8:
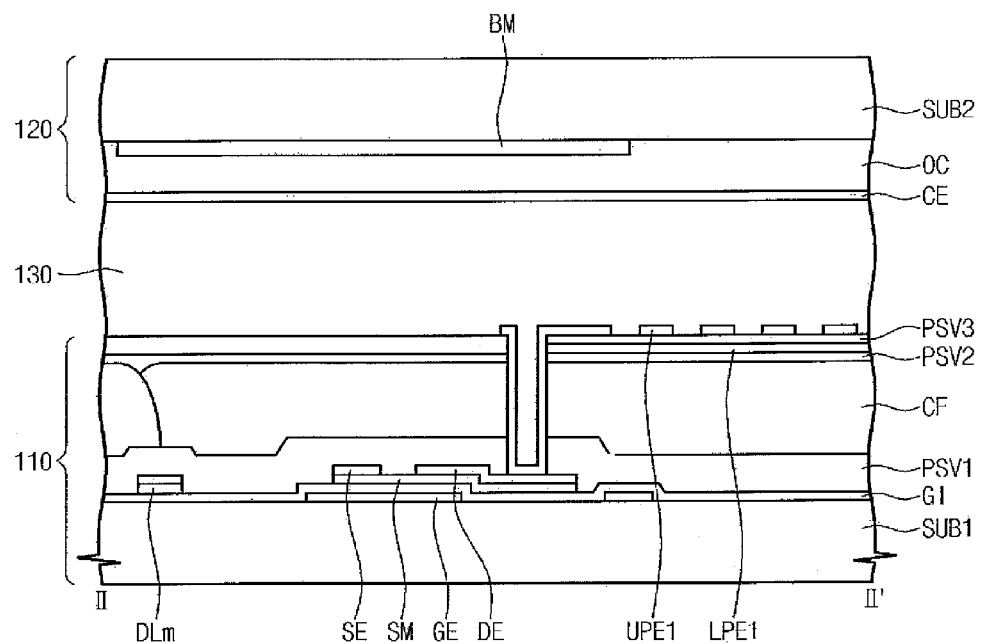
FIG. 8 is a cross-sectional view taken along line shown in FIG. 7, according to an exemplary embodiment of the present disclosure.
Figure 9:
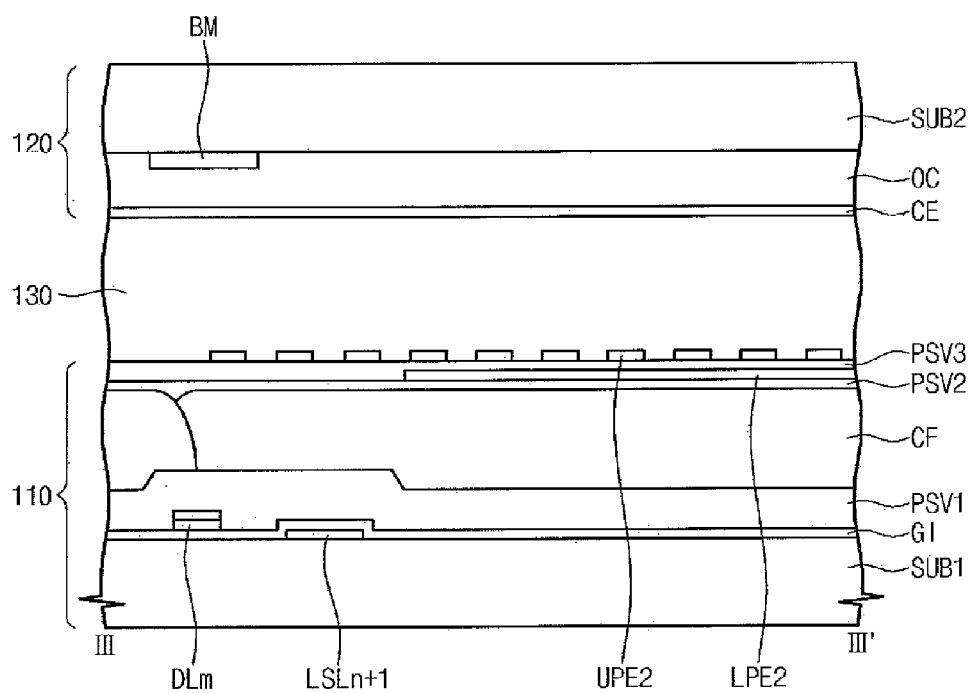
FIG. 9 is a cross-sectional view taken along line III-III' shown in FIG. 7, according to an exemplary embodiment of the present disclosure.
Figure 10:
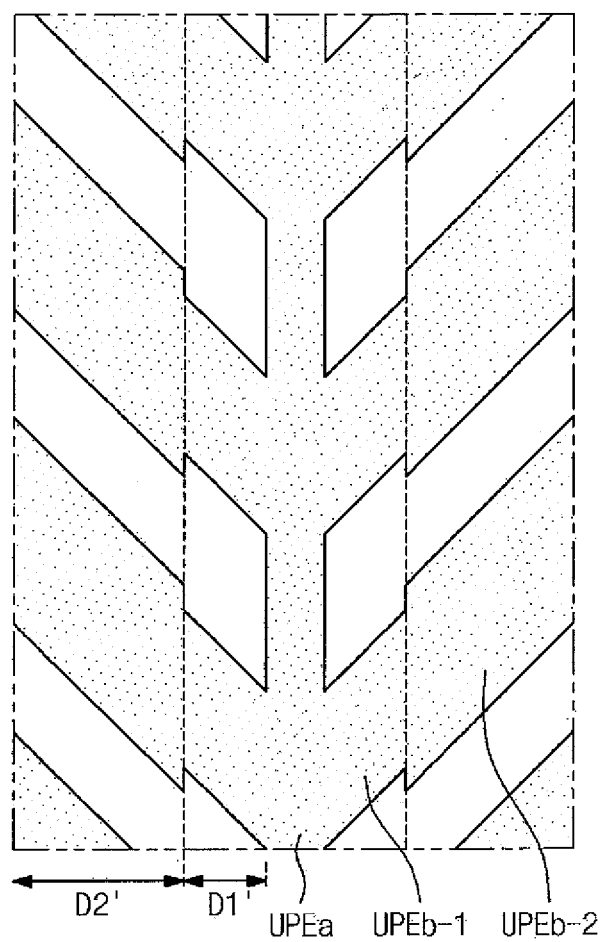
FIG. 10 is a plan view showing portion B of FIG. 7, according to an exemplary embodiment of the present disclosure.

FIG. 7 is a plan view showing a portion of a liquid crystal display according to an exemplary embodiment of the present disclosure. FIG. 8 is a cross-sectional view taken along line II-II' of FIG. 7, according to an exemplary embodiment of the present disclosure. FIG. 9 is a cross-sectional view taken along line of FIG. 7, according to an exemplary embodiment of the present disclosure. FIG. 10 is a plan view showing a portion B of FIG. 7, according to an exemplary embodiment of the present disclosure. In FIGS. 7 to 10, the same reference numerals may denote the same elements in FIGS. 1 to 6.

In the exemplary embodiment described with reference to FIGS. 7 to 10, each pixel has a charge distribution structure.

Referring to FIGS. 7 to 10, a liquid crystal display includes an array substrate 110, an opposite substrate 120 facing the array substrate 110, and a liquid crystal layer 130 interposed between the array substrate 110 and the opposite substrate 120.

The array substrate 110 includes a first base substrate SUB1 having a plurality of pixel areas. The first base substrate SUB1 includes n+p gate lines GL1, . . . , GLn, GLn+1, . . . , GL(n+p)−1, and GLn+p and m+q data lines DL1, . . . , DLm, . . . , DLm+1, . . . , DL(m+q)−1, and DLm+q.

In FIGS. 7 to 10, one pixel PXL is illustrated with an n-th gate line GLn and an (n+1)th gate line GLn+1 among the gate lines GL1, . . . , GLn, GLn+1, . . . , GL(n+p)−1, and GLn+p, and an m-th data line DLm and an (m+1)th data line DLm+1 among the data lines DL1, . . . , DLm, . . . , DLm+1, . . . , DL(m+q)−1, and DLm+q. Referring to FIGS. 7 to 10, other pixels may have substantially the same configuration as the pixel PXL, the n-th gate line GLn and the (n+1)th gate line GLn+1 will be respectively referred to as a first gate line and a second gate line, and the m-th data line DLm and the (m+1)th data line DLm+1 will be respectively referred to as a first data line and a second data line.

The first and second gate lines GLn and GLn+1 are extended substantially parallel to each other in a first direction DR1 on the first base substrate SUB1. The first and second data lines DLm and DLm+1 are extended in a second direction DR2 that is substantially perpendicular to the first direction DR1. A gate insulating layer GI is interposed between the gate lines GLn and GLn+1 and the data lines DLm and DLm+1.

Each pixel. PXL includes a first sub-pixel and a second sub-pixel. The first sub-pixel includes a first thin film transistor Tr1, a first upper pixel electrode UPE1 and a first lower pixel electrode LPE1, which are connected to the first thin film transistor Tr1, and a first storage electrode part. The second sub-pixel includes a second thin film transistor Tr2, a second storage electrode part, a third thin film transistor Tr3, a second upper pixel electrode UPE2 and a second lower pixel electrode LPE2, which are connected to the second thin film transistor Tr2, and a coupling capacitor electrode CP1. The first and second sub-pixels are arranged between the first data line DLm and the second data line DLm+1, which are adjacent to each other.

The first thin film transistor Tr1 of the first sub-pixel is connected to the first data line DLm and the first gate line GLn.

The first thin film transistor Tr1 includes a first gate electrode GE1 branched from the first gate line GLn and a first source electrode SE1 branched from the first data line DLm. The first thin film transistor Tr1 includes a first drain electrode DE1 spaced apart from the first source electrode SE1, and interposing a semiconductor layer SM therebetween. A portion of the first drain electrode DE1 is overlapped with the first gate electrode GE1.

A first passivation layer PSV1 is disposed on the first base substrate SUB1 on which the first source electrode SE1 and the first drain electrode DE1 are formed. A color filter CF that displays a color corresponding to each pixel PXL is disposed on the first passivation layer PSV1, and a second passivation layer PSV2 is disposed on the color filter CF.

The first lower pixel electrode LPE1 may be formed as a single unitary and individual plate unit on the second passivation layer PSV2. A third passivation layer PSV3 is disposed on the first lower pixel electrode LPE1, and the first upper pixel electrode UPE1 is disposed on the third passivation layer PSV3 and overlaps with at least a portion of the first lower pixel electrode LPE1.

The first upper pixel electrode UPE1 includes a trunk portion UPE1a and a plurality of branch portions UPE1b protruded and extended from the trunk portion UPE1a. The branch portions UPE2b are extended to an area in which the first storage electrode part and the first and second data lines DLm and DLm+1 are formed.

The first lower pixel electrode LPE1 includes edges crossing a longitudinal direction of the branch portions UPE1b when viewed in a plan view. Portions of the edges are disposed between the trunk portion UPE1a and end portions of the branch portions UPE1b. Thus, the first upper pixel electrode UPE1 includes an area overlapped with the first lower pixel electrode LPE1, and an area that is not overlapped with the first lower pixel electrode LPE1. The end portions of the branch portions UPE1b are arranged in the area that is not overlapped with the first lower pixel electrode LPE1. The ends portions of the branch portions UPE1b are spaced apart from the edges of the first lower pixel electrode LPE1 by about 3 μm or more.

The first and second passivation layers PSV1 and PSV2 have a contact hole formed therethrough, which exposes a portion of the first drain electrode DE1 of the first thin film transistor Tr1. The first upper pixel electrode UPE1 makes contact with the first drain electrode DE1 through the contact hole. The first lower pixel electrode LPE1 may directly make contact with the first upper pixel electrode UPE1, which is formed inside the contact hole, to be electrically connected to the first drain electrode DE1.

The first storage electrode part includes a first storage line SLn extended in the first direction DR1, and a first branch electrode LSLn and a second branch electrode RSLn branched from the first storage line SLn and extended in the second direction DR2.

The first upper pixel electrode UPE1 is partially overlapped with the first storage line SLn and the first and second branch electrodes LSLn and RSLn, forming a first storage capacitor. In addition, the first and second branch electrodes LSLn and RSLn shield a coupling electric field between the first and second data lines DLm and DLm+1 and the first upper pixel electrode UPE1, and between the first and second data lines DLm and DLm+1 and the first lower pixel electrode LPE1.

The second thinfilm transistor Tr2 includes a second gate electrode GE2 branched from the first gate line GLn and a second source electrode SE2 branched from the first data line DLm. The second thin film transistor Tr2 includes a second drain electrode DE2 spaced apart from the second source electrode SE2 and interposing the semiconductor layer SM therebetween. A portion of the second drain electrode DE2 is overlapped with the second gate electrode GE2.

The first passivation layer PSV1 is disposed on the first base substrate SUB1 on which the second source electrode SE2 and the second drain electrode DE2 are formed. The color filter CF is disposed on the first passivation layer PSV1, and the second passivation layer PSV2 is disposed on the color filter CF.

The second drain electrode DE2 of the second thin film transistor Tr2 is electrically connected to the second lower pixel electrode LPE2 and the second upper pixel electrode UPE2. The second lower pixel electrode LPE2 may be formed as a single unitary and individual plate unit on the second passivation layer PSV2. The third passivation layer PSV3 is disposed on the second lower pixel electrode LPE2, and the second upper pixel electrode UPE2 is disposed on the third passivation layer PSV3 and is partially overlapped with the second lower pixel electrode LPE2. A portion of the second upper pixel electrode UPE2 is overlapped with the second lower pixel electrode LPE2.

The second upper pixel electrode UPE2 includes a trunk portion UPE2a and a plurality of branch portions UPE2b protruded and extended from the trunk portion UPE2a. The branch portions UPE2b are extended to an area in which the second storage electrode part and the first and second data lines DLm and DLm+1 are formed.

The second lower pixel electrode LPE2 includes edges crossing a longitudinal direction of the branch portions UPE2b when viewed in a plan view. Portions of the edges are disposed between the trunk portion UPE2a and end portions of the branch portions UPE2b. Thus, the second upper pixel electrode UPE2 includes an area overlapped with the second lower pixel electrode LPE2, and an area that is not overlapped with the second lower pixel electrode LPE2. The end portions of the branch portions UPE2b are arranged in the area that is not overlapped with the second lower pixel electrode LPE2. The end portions of the branch portions UPE2b are spaced apart from the edges of the second lower pixel electrode LPE2 by about 3 μm or more.

The first and second passivation layers PSV1 and PSV2 have a contact hole formed therethrough, which exposes a portion of the second drain electrode DE2 of the second thin film transistor Tr2. The second upper pixel electrode UPE2 makes contact with the second drain electrode DE2 through the contact hole. The second lower pixel electrode LPE2 may directly make contact with the second upper pixel electrode UPE2 formed inside the contact hole so as to be electrically connected to the second drain electrode DE2.

The second storage electrode part includes a second storage line SLn+1 extended in the first direction DR1, and a third branch electrode LSLn+1 and a fourth branch electrode RSLn+1, which are branched from the second storage line SLn+1 and extended in the second direction DR2.

The second upper pixel electrode UPE2 is partially overlapped with the second storage line SLn+1 and the third and fourth branch electrodes LSLn+1 and RSLn+1, forming a second storage capacitor. In addition, the third and fourth branch electrodes LSLn+1 and RSLn+1 shield a coupling electric field between the first and second data lines DLm and DLm+1 and the second upper pixel electrode UPE2, and between the first and second data lines DLm and DLm+1 and the second lower pixel electrode LPE2.

The third thin film transistor Tr3 includes a third gate electrode GE3 branched from the second gate line GLn+1, a third source electrode SE3 extended from the second drain electrode DE2, and a third drain electrode DE3 connected to the coupling capacitor electrode CP1. The coupling capacitor electrode CP1 forms a coupling capacitor CCP in cooperation with an opposite electrode CP2 extended from the second branch electrode RSLn. However, the structure of the coupling capacitor CCP is not limited thereto.

The opposite substrate 120 includes a second base substrate SUB2, a black matrix BM, an overcoat layer OC, and a common electrode CE.

The black matrix BM is disposed on the second base substrate SUB2 in an area corresponding to the area in which the first and second data lines DLm and DLm+1 are disposed, and may prevent or reduce light leakage caused by misalignment of the liquid crystal molecules.

The overcoat layer OC is disposed on the black matrix BM and reduces a step difference caused by the black matrix BM.

The common electrode CE is disposed on the overcoat layer OC and forms an electric field in cooperation with the first and second lower pixel electrodes LPE1 and LPE2 and the first and second upper pixel electrodes UPE1 and UPE2 when a predetermined voltage is applied thereto.

Each of the trunk portions UPE1a and UPE2a of the first upper pixel electrode UPE1 and the second upper pixel electrode UPE2 may have a cross shape. Further, the branch portions UPE1b and UPE2b of the first upper pixel electrode UPE1 and the second upper pixel electrode UPE2 are inclined to the trunk portions UPE1a and UPE2a. Each of the branch portions UPE1b and UPE2b includes a first area UPEb-1 extended from the trunk portions UPE1a and UPE2a, and a second area UPEb-2 extended from the first area UPEb-1. The first area UPEb-1 is disposed in an adjacent area D1' and the second area UPEb-2 is disposed in a distant area D2'.

A width of the second area UPEb-2 is greater than a width of the first area UPEb-1. As a result, a distance between two adjacent first areas UPEb-1 is greater than a distance between two adjacent second areas UPEb-2.

According to exemplary embodiments, the width of the first areas UPEb-1 may be substantially the same as the distance between the two adjacent first areas UPEb-1.

According to an exemplary embodiment, a sum of the distance between the two adjacent first areas UPEb-1 and the width of the first area UPEb-1 may be substantially the same as a sum of the distance between the two adjacent second areas UPEb-2 and the width of the second area UPEb-2.

According to exemplary embodiments, as shown, for example, in FIG. 10, a distance between the trunk portion UPE2a and the second areas UPE2b-2 may be substantially equal to a distance between the trunk portion UPE2a and the distant areas D2'. The distance between the trunk portion UPE2a and the second areas UPE2b-2 may be about one to about three times the width of the trunk portion UPE2a. The distance between the trunk portion UPE2a and the second areas UPE2b-2 may be in a range from about 10 µm to about 20 µm. The width of the trunk portion UPE2a may be in a range from about 1 µm to about 8 µm.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An array substrate, comprising:
    a gate line;
    a data line insulated from the gate line and crossing the gate line; and
    a pixel comprising at least one thin film transistor connected to the gate line and the data line, and a pixel electrode connected to the thin film transistor, wherein the pixel electrode comprises:
        a trunk portion; and
        a plurality of branch portions inclined toward the trunk portion and spaced apart from each other, wherein each of the branch portions comprises a first portion of a first area extending from the trunk portion to a second area, the second area extending from the first portion of the first area to a second portion of the first area, and the second portion of the first area extending from the second area, wherein a width of the second area is greater than a width of the first portion of the first area and a width of the second portion of the first area.

2. The array substrate of claim 1, wherein the trunk portion has a cross shape and divides the pixel into a plurality of domains.

3. The array substrate of claim 2, wherein each of the domains comprises:
    an adjacent area adjacent to the trunk portion; and
    a distant area spaced apart from the trunk portion.

4. The array substrate of claim 3, wherein the first portion of the first area is disposed in the adjacent area and the second area is disposed in the distant area.

5. The array substrate of claim 3, wherein a size of the distant area is greater than a size of the adjacent area.

6. The array substrate of claim 1, wherein a distance between two adjacent first portions of first areas is greater than a distance between two adjacent second areas.

7. The array substrate of claim 6, wherein the width of the first portion of the first area is substantially equal to the distance between the two adjacent first portions of the first areas.

8. The array substrate of claim 6, wherein a sum of the distance between the two adjacent first portions of the first areas and the width of the first portion of the first area is substantially equal to a sum of the distance between the two adjacent second areas and the width of the second area.

9. The array substrate of claim 1, wherein a distance between two adjacent branch portions is about equal to or less than the width of the second area.

10. The array substrate of claim 1, wherein a distance between the trunk portion and the second area is about one to about three times greater than a width of the trunk portion.

11. The array substrate of claim 10, wherein the width of the trunk portion is in a range from about 1 µm to about 8 µm.

12. The array substrate of claim 11, wherein the distance between the trunk portion and the second area is in a range from about 10 µm to about 20 µm.

13. The array substrate of claim 1, wherein the pixel further comprises:
    a first passivation layer covering the thin film transistor;
    a lower pixel electrode disposed on the first passivation layer; and
    a second passivation layer disposed on the lower pixel electrode, wherein the pixel electrode is disposed on the second passivation layer.

14. The array substrate of claim 1, wherein the at least one thin film transistor is a first thin film transistor, the pixel electrode is a first pixel electrode, and the pixel further comprises:
    a second thin film transistor; and
    a second pixel electrode,
    wherein the first pixel electrode is connected to the first thin film transistor, and the second pixel electrode is spaced apart from the first pixel electrode and is connected to the second thin film transistor.

15. A liquid crystal display, comprising:
    an array substrate;
    an opposite substrate facing the array substrate and comprising a common electrode; and
    a liquid crystal layer interposed between the array substrate and the opposite substrate,
    wherein the array substrate comprises a gate line, a data line insulated from the gate line and crossing the gate line, and a pixel connected to the gate line and the data line,
    wherein the pixel comprises at least one thin film transistor connected to the gate line and the data line, and a pixel electrode connected to the thin film transistor,
    wherein the pixel electrode comprises:
        a trunk portion; and
        a plurality of branch portions inclined toward the trunk portion and spaced apart from each other, wherein each of the branch portions comprises a first portion of a first area extending from the trunk portion to a second area, the second area extending from the first portion of the first area to a second portion of the first area, and the second portion of the first area extending from the second area, wherein a width of the second area is greater than a width of the first portion of the first area and a width of the second portion of the first area.

16. The liquid crystal display of claim 15, wherein the trunk portion has a cross shape and divides the pixel into a plurality of domains, and each of the domains comprises:
    an adjacent area adjacent to the trunk portion; and
    a distant area spaced apart from the trunk portion,
    wherein the first portion of the first area is disposed in the adjacent area, and the second area is disposed in the distant area.

17. The liquid crystal display of claim 15, wherein a distance between two adjacent first portions of first areas is greater than a distance between two adjacent second areas.

18. The liquid crystal display of claim 17, wherein a sum of the distance between the two adjacent first portions of the first areas and the width of the first portion of the first area is substantially equal to a sum of the distance between the two adjacent second areas and the width of the second area.

19. The liquid crystal display of claim 15, wherein a distance between two adjacent branch portions is about equal to or less than the width of the second area.

20. The liquid crystal display of claim 15, wherein a distance between the trunk portion and the second area is about one to about three times greater than a width of the trunk portion.

21. The liquid crystal display of claim 20, wherein the width of the trunk portion is in a range from about 1 μm to about 8 μm.

22. The liquid crystal display apparatus of claim 21, wherein the distance between the trunk portion and the second area is in a range from about 10 μm to about 20 μm.

* * * * *